(12) United States Patent
Shen et al.

(10) Patent No.: US 11,316,103 B2
(45) Date of Patent: Apr. 26, 2022

(54) COMBINED PHYSICAL AND CHEMICAL ETCH TO REDUCE MAGNETIC TUNNEL JUNCTION (MTJ) SIDEWALL DAMAGE

(71) Applicant: Taiwan Semiconductor Manufacturing Company, Ltd., Hsinchu (TW)

(72) Inventors: Dongna Shen, San Jose, CA (US);
Yu-Jen Wang, San Jose, CA (US);
Ru-Ying Tong, San Gatos, CA (US);
Vignesh Sundar, Sunnyvale, CA (US);
Sahil Patel, Fremont, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 5 days.

(21) Appl. No.: 16/728,036

(22) Filed: Dec. 27, 2019

(65) Prior Publication Data

US 2020/0144492 A1 May 7, 2020

Related U.S. Application Data

(62) Division of application No. 15/595,484, filed on May 15, 2017, now Pat. No. 10,522,749.

(51) Int. Cl.
*H01L 43/12* (2006.01)
*H01L 21/306* (2006.01)
(Continued)

(52) U.S. Cl.
CPC .......... *H01L 43/12* (2013.01); *B81C 1/00111* (2013.01); *B81C 1/00523* (2013.01);
(Continued)

(58) Field of Classification Search
None
See application file for complete search history.

(56) References Cited

U.S. PATENT DOCUMENTS 6,806,096 B1 10/2004 Kim et al.
6,984,529 B2 1/2006 Stojakavic et al.
(Continued)

FOREIGN PATENT DOCUMENTS

| DE | 102004043855 A1 | 5/2005 |
| EP | 1500720 | 1/2005 |
| JP | 2016-0825019 A | 5/2016 |

OTHER PUBLICATIONS

PCT Search Report, International Application No. PCT/US2018/032196, Applicant: Headway Technologies, Inc., dated Aug. 24, 2018, 14 pages.

(Continued)

*Primary Examiner* — Allan W. Olsen
(74) *Attorney, Agent, or Firm* — Haynes and Boone, LLP (57) ABSTRACT

A process flow for forming magnetic tunnel junction (MTJ) nanopillars with minimal sidewall residue and minimal sidewall damage is disclosed wherein a pattern is first formed in a hard mask that is an uppermost MTJ layer. Thereafter, the hard mask sidewall is etch transferred through the remaining MTJ layers including a reference layer, free layer, and tunnel barrier between the free layer and reference layer. The etch transfer may be completed in a single RIE step that features a physical component involving inert gas ions or plasma, and a chemical component comprised of ions or plasma generated from one or more of methanol, ethanol, ammonia, and CO. In other embodiments, a chemical treatment with one of the aforementioned chemicals, and a volatilization at 50° C. to 450° C. may (Continued)

follow an etch transfer through the MTJ stack with an ion beam etch or plasma etch involving inert gas ions.

19 Claims, 6 Drawing Sheets

(51) Int. Cl.
  *H01L 21/3065* (2006.01)
  *B82Y 40/00* (2011.01)
  *B81C 1/00* (2006.01)
(52) U.S. Cl.
  CPC .......... *B82Y 40/00* (2013.01); *H01L 21/3065* (2013.01); *H01L 21/30604* (2013.01)

(56) References Cited

U.S. PATENT DOCUMENTS

| | | | |
|---|---|---|---|
| 7,001,783 B2 | 2/2006 | Costrini et al. | |
| 7,060,194 B2 | 6/2006 | Kodaira et al. | |
| 7,696,551 B2 | 4/2010 | Xiao et al. | |
| 8,722,543 B2 | 5/2014 | Belen et al. | |
| 9,166,154 B2 | 10/2015 | Satoh et al. | |
| 9,269,894 B2 | 2/2016 | Mudivarthi et al. | |
| 9,275,713 B2 | 3/2016 | Guo | |
| 9,362,490 B1* | 6/2016 | Xiao | H01L 43/12 |
| 9,608,200 B2 | 3/2017 | Shen et al. | |
| 9,871,195 B1* | 1/2018 | Yang | G11C 11/161 |
| 9,887,350 B2 | 2/2018 | Shen et al. | |
| 9,935,261 B1 | 4/2018 | Patel et al. | |
| 10,347,314 B2* | 7/2019 | Berger | G11C 11/1673 |
| 10,366,775 B2* | 7/2019 | El-Baraji | G06F 12/0804 |
| 2003/0073251 A1 | 4/2003 | Ning | |
| 2005/0016957 A1* | 1/2005 | Kodaira | G11C 11/161 216/67 |
| 2005/0254289 A1* | 11/2005 | Nakajima | B82Y 40/00 365/158 |
| 2005/0277207 A1 | 12/2005 | Costrini et al. | |
| 2007/0215911 A1 | 9/2007 | Torng et al. | |
| 2009/0078927 A1 | 3/2009 | Xiao et al. | |
| 2009/0159563 A1* | 6/2009 | Jung | G11C 11/161 216/22 |
| 2009/0261437 A1 | 10/2009 | Kang et al. | |
| 2011/0037108 A1 | 2/2011 | Sugiura et al. | |
| 2012/0276657 A1* | 11/2012 | Joubert | H01L 43/12 438/3 |
| 2013/0175644 A1 | 7/2013 | Horng et al. | |
| 2014/0170776 A1 | 6/2014 | Satoh et al. | |
| 2014/0256061 A1 | 9/2014 | Mani et al. | |
| 2015/0017741 A1* | 1/2015 | Fujita | H01L 43/12 438/3 |
| 2016/0204342 A1 | 7/2016 | Hayashi et al. | |
| 2016/0351798 A1 | 12/2016 | Shen et al. | |
| 2017/0069834 A1 | 3/2017 | Annapragada et al. | |
| 2017/0125668 A1 | 5/2017 | Paranjpe et al. | |
| 2017/0222139 A1 | 8/2017 | Nishimura et al. | |
| 2018/0033957 A1* | 2/2018 | Zhang | H01L 43/12 |
| 2018/0337025 A1 | 11/2018 | Umezawa et al. | |

OTHER PUBLICATIONS

Kim, E.H., et al., "Evolution of Etch Profile of Magnetic Tunnel Junction Stacks Etched in a CH3OH/Ar Plasma", Journal of The Electrochemical Society, vol. 159, No. 3, Dec. 30, 2011, pp. H230-H234.

Lee, T.L., et al., "Inductively coupled plasma reactive ion etching of magnetic tunnel junction stacks using H2O/CH4 mixture", Thin Solid Films, vol. 547, Apr. 24, 2013, pp. 146-150.

Onani, Y. et al., "Microfabrication of Magnetic Tunnel Junctions Using CH3OH Etching", IEEE Transactions on Magnetics, vol. 43, No. 6, Jun. 2007, pp. 2776-2778.

Kobayashi, A., et al., "TMR devices fabricated with RIE etching using CO+NH3", Journal of The Magnetics Society of Japan, vol. 28, No. 2, 2004, pp. 176-179, XP055499643, ISSN: 0285-0192.

Eun Ho Kim, Tae Young Lee, Chee Won Chung, Evolution of Etch Profile of Magnetic Tunnel Junction Stacks Etched in a CH3OH/Ar Plasma, In: Journal of the Electrochemical Society, 159, 2012, pp. H230 to H234 Dec. 30, 2011.

Office Action dated Oct. 30, 2021, issued by German Patent and Trademark Office in DE 11.2018.002.498.9, 7 pages (translated) Oct. 30, 2021.

* cited by examiner

COMBINED PHYSICAL AND CHEMICAL ETCH TO REDUCE MAGNETIC TUNNEL JUNCTION (MTJ) SIDEWALL DAMAGE

PRIORITY DATA

The present application is a continuation application of U.S. patent application Ser. No. 15/595,484, filed May 15, 2017, which is herein incorporated by reference in its entirety.

RELATED PATENT APPLICATION

This application is related to U.S. Pat. No. 8,722,543; which is assigned to a common assignee and is herein incorporated by reference in its entirety.

TECHNICAL FIELD

The present disclosure relates to a method of reducing MTJ sidewall damage during an etch process that transfers a mask pattern through a MTJ stack of layers thereby generating an array of MTJ nanopillars with improved magnetoresistive ratio and other magnetic properties.

BACKGROUND

A MTJ memory element is also referred to as a MTJ nanopillar and is a key component in magnetic recording devices, and in memory devices such as magnetoresistive random access memory (MRAM) and spin torque transfer (STT)-MRAM. An important step in fabricating an array of MTJs is etch transfer of a pattern in an overlying hard mask through a MTJ stack of layers to form an array of MTJ nanopillars with a critical dimension (CD) that in state of the art devices is substantially less than 100 nm from a top-down view. The etch transfer process typically involves a plurality of etch steps involving reactive ion etch (RIE) and/or ion beam etch (IBE).

A MTJ stack of layers includes two ferromagnetic layers called the free layer (FL) and reference layer (RL), and a dielectric layer (tunnel barrier) between the FL and RL. The RL has a fixed magnetization preferably in a perpendicular-to-plane direction (referred to as perpendicular magnetic anisotropy or PMA) while the FL is free to rotate to a direction that is parallel or anti-parallel to the RL magnetization direction thereby establishing a "0" or "1" memory state for the MTJ. The magnetoresistive ratio is expressed by dR/R where dR is the difference in resistance between the two magnetic states when a current is passed through the MTJ, and R is the minimum resistance value.

The bottommost MTJ layer is usually a non-magnetic seed layer that promotes uniform growth in overlying layers, and enhances PMA in the overlying RL or FL. A capping layer such as Ta is generally formed as the uppermost MTJ layer and serves as a protective layer during subsequent physical and chemical etches. Thus, a single etch transfer process through the MTJ stack of layers is challenging since there are a variety of materials (magnetic alloys, non-magnetic metals, and dielectric films) that each have a different etch rate when subjected to IBE with Ar or to conventional $CH_3OH$ based RIE. In particular, methanol RIE causes chemical and plasma damage on MTJ sidewalls although there is minimal redeposition of etched material on the sidewalls. On the other hand, IBE produces no chemical damage and leaves minimal plasma damage, but results in a high degree of redeposited material on MTJ sidewalls. When metal such as Ta is redeposited on the tunnel barrier, shorting may easily occur and render the device unusable.

Current technology does not provide a single etch solution for transferring a hard mask pattern through an entire MTJ stack of layers without either a substantial redeposition of one or more MTJ materials on the MTJ sidewalls, or significant damage to the sidewalls. In any case, removal of material from the sidewalls requires one or more extra steps that reduce throughput and add cost. Moreover, damaged sidewalls are difficult to repair and often lead to reduced yield and therefore higher cost per unit of acceptable product. Therefore, a new method for etching a MTJ stack of layers in a single etch process is needed for higher throughput and lower cost, and the method must maintain or improve magnetic properties including the magnetoresistive ratio in the MTJ nanopillar. Furthermore, a process flow for etching MTJ sidewalls is desired that substantially reduces sidewall damage for devices with diameter (CD) around 60 nm or less.

SUMMARY

One objective of the present disclosure is to provide a method for etching all layers in a MTJ stack below the hard mask with a single etch step that leaves minimal residue.

A second objective of the present disclosure is to provide a process flow for MTJ etching that satisfies the first objective and substantially reduces sidewall damage and associated edge effects compared with conventional methanol based RIE thereby enabling improved device performance, especially for MTJ nanopillars with critical dimensions $\leq 60$ nm.

According to a preferred embodiment, the first objective is achieved with a MTJ stack of layers having at least a reference layer, free layer, a tunnel barrier between the free layer and reference layer, and an uppermost hard mask. In some embodiments, a seed layer is employed as the bottommost MTJ layer. A pattern comprising a plurality of island features with the desired critical dimension for the eventual MTJ nanopillars is first defined in a photoresist mask layer above the hard mask layer. Preferably, there is a bottom anti-reflective coating (BARC) or a dielectric anti-reflective coating (DARC) between the hard mask and photoresist mask layer that has better resistance to subsequent etch processes than the photoresist mask. The pattern is etch transferred through the BARC or DARC by a first RIE or IBE step, and is then transferred through the hard mask by continuing the first etch step, or by performing a second RIE step comprised of a fluorocarbon or chlorocarbon gas, or by a second IBE step.

According to one embodiment of the present disclosure, the pattern of island features is then transferred through the remaining MTJ layers by a RIE step comprising an inert gas, and a chemical such as methanol, ethanol, ammonia, or a combination of CO and $NH_3$. In particular, Ar ions or the like provide a physical component to the etch while the one or more chemicals provide a plasma component for chemical etching. As a result, inert gas ions or plasma substantially minimize chemical damage to the MTJ sidewalls, and redeposition of etched residue on the MTJ sidewalls is significantly reduced by the chemical component. In fact, depending on the composition of the MTJ layers, etch conditions may be optimized to yield minimal sidewall residue, and substantially less sidewall damage than in conventional methanol based RIE. Thereafter, an encapsulation layer is deposited on the resulting MTJ nanopillars, and then a chemical mechanical polish (CMP) process is performed to remove all layers above the hard mask. The CMP process forms a hard mask top surface that is coplanar with the surrounding encapsulation layer. From a top-down view, the MTJ nanopillars form an array of circular or elliptical shapes, for example.

In a second embodiment, a process sequence is used to transfer the pattern of island shapes in the hard mask through the remaining MTJ layers thereby generating a plurality of MTJ nanopillars that has minimal sidewall damage and residue. A first process flow comprises an IBE step and then a separate chemical treatment to convert non-volatile residue on MTJ sidewalls into a volatile residue. Thereafter, a second IBE step, plasma sputter etch step, or a thermal treatment is employed to remove the volatile residue. A second process flow includes a RIE step and then a separate chemical treatment wherein the chemical may be applied without plasma to transform any sidewall residue into a volatile form. Next, an optional IBE step, plasma sputter etch step, or thermal treatment is used to remove the volatile residue. In other embodiments, RIE is alternated with IBE before the optional chemical treatment, and optional volatilization step.

BRIEF DESCRIPTION OF THE DRAWINGS

FIG. 12 is a plot of magnetoresistive ratio vs. MTJ size for MTJs that have been ion beam etched with no post-cleaning process while

DETAILED DESCRIPTION

The present disclosure is a method of etching a MTJ stack of layers wherein all layers below the hard mask are removed with a single etch process comprised of both physical and chemical components to form a MTJ nanopillar with sidewalls that have substantially less sidewall damage compared with conventional methanol based RIE, and minimal residue. An alternative process sequence is provided where the physical and chemical etchants are alternated, or are in separate steps and followed by a chemical treatment and an optional volatilization process to achieve improved MTJ performance. Although only one MTJ nanopillar is depicted in the drawings with cross-sectional views, one skilled in the art will appreciate that a plurality of MTJ nanopillars is formed in a typical memory device pattern. A process is defined as a method that includes one or more steps, and a sequence or process flow according to the present disclosure refers to two or more processes in succession.

Figure 1:
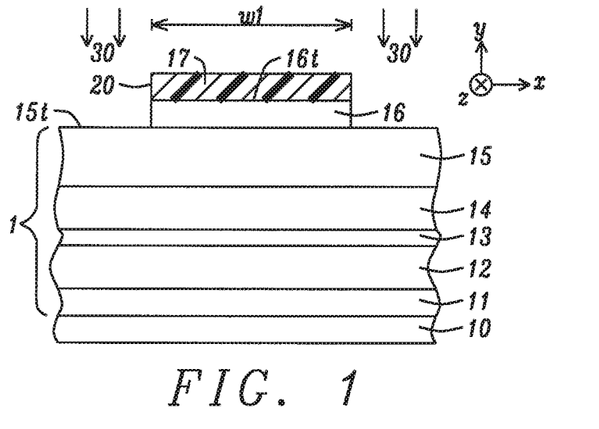
FIG. 1 is a cross-sectional view of a MTJ stack of layers on which a photoresist pattern has been formed, and shows ions used to transfer the pattern through an underlying BARC or DARC during an etch sequence of the present disclosure.

Referring to FIG. 1, a MTJ stack of layers 1 that will eventually become a plurality of MTJ nanopillars in a MRAM or STT-MRAM is shown from a cross-sectional view. The y-axis is perpendicular to the planes of the layers in the MTJ stack. There is a substrate 10 that in one embodiment is a bottom electrode in a memory device. The bottom electrode may be a multilayer structure and is typically embedded in a dielectric layer (not shown).

MTJ stack 1 is laid down on the substrate 10 and in the exemplary embodiment has a bottom spin valve configuration wherein a seed layer 11, pinned or reference layer 12, tunnel barrier 13, free layer 14, and hard mask 15 are sequentially formed on the substrate. Each of the reference layer and free layer preferably have PMA with a magnetization aligned in a y-axis direction. In other embodiments, at least one additional layer may be included in the aforementioned MTJ stack such as a Hk enhancing layer between the free layer and hard mask that enhances PMA in the free layer. The seed layer may be comprised of one or more of NiCr, Ta, Ru, Ti, TaN, Cu, Mg, or other materials typically employed to promote a smooth and uniform grain structure in overlying layers.

The reference layer 12 may have a synthetic anti-parallel (SyAP) configuration represented by AP2/Ru/AP1 where a anti-ferromagnetic coupling layer made of Ru, Rh, or Ir, for example, is sandwiched between an AP2 magnetic layer and an AP1 magnetic layer (not shown). The AP2 layer, which is also referred to as the outer pinned layer is formed on the seed layer while AP1 is the inner pinned layer and typically contacts the tunnel barrier. AP1 and AP2 layers may be comprised of CoFe, CoFeB, Co, or a combination thereof. In other embodiments, the reference layer may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB or Co may be inserted between the uppermost layer in the laminated stack and the tunnel barrier layer.

The tunnel barrier layer 13 is preferably a metal oxide that is one of MgO, TiOx, AlTiO, MgZnO, $Al_2O_3$, ZnO, ZrOx, HfOx, or MgTaO. More preferably, MgO is selected as the tunnel barrier layer because it provides the highest magnetoresistive ratio, especially when sandwiched between two CoFeB layers, for example.

The free layer 14 may be Co, Fe, CoFe, or an alloy thereof with one or both of B and Ni, or a multilayer stack comprising a combination of the aforementioned compositions. In another embodiment, the free layer may have a non-magnetic moment diluting layer such as Ta or Mg inserted between two CoFe or CoFeB layers that are ferromagnetically coupled. In an alternative embodiment, the free layer has a SyAP configuration such as FL1/Ru/FL2 where FL1 and FL2 are two magnetic layers that are antiferromagnetically coupled, or is a laminated stack with inherent PMA described previously with respect to the reference layer composition.

The hard mask 15 is also referred to as a capping layer and is typically comprised of one or more of Ta, Ru, TaN, Ti, TiN, and W. It should be understood that other hard mask materials including MnPt may be selected in order to provide high etch selectivity relative to underlying MTJ layers during an etch process that forms MTJ nanopillars with sidewalls that stop on the bottom electrode. All layers in the MTJ stack may be deposited in a DC sputtering chamber of a sputtering system such as an Anelva C-7100 sputter deposition system that includes ultra high vacuum DC magnetron sputter chambers with multiple targets and at least one oxidation chamber. Usually, the sputter deposition process involves an argon sputter gas and a base pressure between $5 \times 10^{-8}$ and $5 \times 10^{-9}$ torr.

Once all of the layers 11-15 are laid down, the MTJ stack 1 may be annealed by heating to a temperature between about 360° C. to 400° C. for a period of up to a plurality of hours to grow a bcc structure in the reference layer, free layer, and tunnel barrier layer thereby enhancing PMA in the reference layer and free layer. The matching crystal structure in the aforementioned layers is also believed to improve the magnetoresistive ratio in the resulting MTJ nanopillars.

As a first step in the MTJ patterning process according to the present disclosure, a BARC or DARC layer 16, and a photoresist layer 17 are sequentially coated on the top surface 15t of the hard mask. BARC or DARC with top surface 16t has a refractive index that minimizes reflection of light during the subsequent patternwise exposure thereby enabling more uniform island shapes with less CD variation to be formed in the photoresist layer. Next, a conventional patternwise exposure and developer sequence is employed to form a pattern in the photoresist layer that comprises a plurality of islands with sidewall 20. As indicated later by a top-down view in FIG. 8, the islands are in an array with a plurality of rows and columns. However, only one island is shown in FIG. 1 in order to simplify the drawing. Each island has a critical dimension w1 that in some embodiments is between 60 nm and 100 nm, and in other embodiments is from about 10 nm to 60 nm that corresponds to the CD required in state of the art memory devices. Note that some devices are circular such that w1 is formed in both of the x-axis and z-axis directions. However, the top-down shape of island 17 may be an ellipse or a polygon such that the z-axis dimension is different from the x-axis dimension.

In the initial etch step 30 that may be an IBE with one or more of Ar, Kr, Xe, or Ne, or may comprise RIE with a fluorocarbon or chlorocarbon gas, the island shape in photoresist layer 17 is transferred through the BARC or DARC layer 16. Accordingly, sidewall 20 now extends from a top surface of the photoresist layer to a top surface 15t of the hard mask 15, and CD w1 is duplicated in the DARC or BARC layer. The photoresist layer may then be removed with a well known method, or is etched away during subsequent etch processes.

Figure 2:
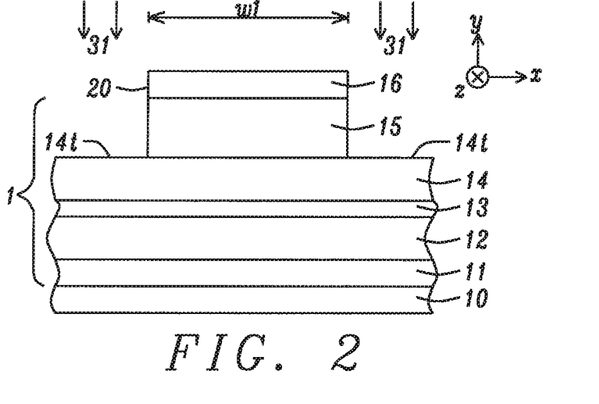
FIG. 2 is a cross-sectional view of a MTJ stack in FIG. 1 after an etch process transfers the pattern through the uppermost hard mask MTJ layer according to an embodiment of the present disclosure.

Referring to FIG. 2, a second etch process 31 is performed to transfer the island shape with sidewall 20 and CD w1 through the hard mask 15. In some embodiments, a second IBE with inert gas, or a second fluorocarbon or chlorocarbon based RIE may be used. Moreover, the second IBE or RIE may include oxygen. However, in other embodiments, the present disclosure anticipates that the conditions employed for etch process 31 are essentially the same as applied in etch process 30 such that the etch transfer through the hard mask may be a continuation of the etch transfer through DARC or BARC layer 16. In other words, etch 30 in FIG. 1 may be continued until stopping on top surface 14t of the free layer. As mentioned earlier, the etch transfer process through the hard mask is likely to remove any remaining photoresist layer 17 because the etch rate through the latter is generally high relative to the hard mask, and the hard mask may be substantially thicker than the remaining photoresist layer once etch process 30 clears the exposed DARC or BARC layer 16. In some embodiments, a passivation step comprised of applying oxygen plasma or flowing oxygen into the process chamber immediately after the second RIE or IBE is completed, and without breaking a vacuum, is performed to generate a smoother sidewall 20.

In the embodiments described herein, it should be understood that IBE typically comprises rotating the work piece (wafer) on which the MTJ stack of layers is formed. Moreover, the incident or penetration angle of noble gas ions directed at the wafer surface may be between 0° and 90°. IBE may be employed in one or more of hard mask etching, MTJ etching, cleaning, and volatilization steps described in later sections. On the other hand, RIE is used only for hard mask or MTJ etching, involves a chemical reactant and stationary wafer, and the resulting plasma is limited to a 90° direction or orthogonal to the wafer surface. According to the present disclosure, a plasma sputter etch is employed only for volatilization or cleaning steps, comprises a noble gas, and is also limited to a 90° direction (orthogonal to wafer surface).

Figure 3:
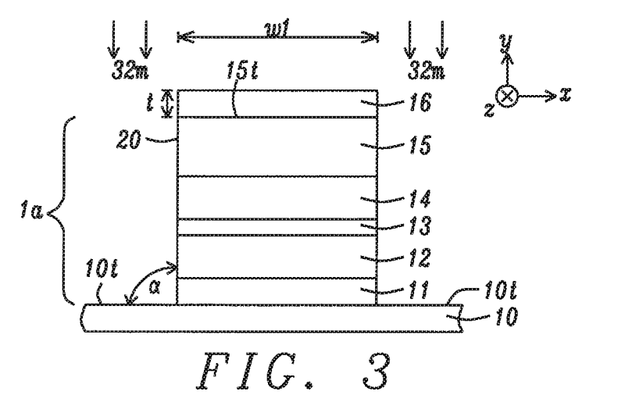
FIG. 3 is cross-sectional view of a MTJ nanopillar after an etch that combines physical and chemical components is used to transfer the hard mask pattern in FIG. 2 through the remaining MTJ stack of layers according to an embodiment described herein.

Referring to FIG. 3, a key feature according to a first embodiment of the present disclosure is a single RIE step 32m that effectively transfers the island shape in the hard mask through all of the underlying MTJ layers 11-14 thereby forming MTJ nanopillar 1a. Etch step 32m comprises a physical component represented by inert gas ions or plasma, and a chemical component comprising ions or plasma of a chemical species that are generated with reactive ion etch conditions. Here, inert gas is defined as a noble gas that is one of Ar, Kr, Ne, and Xe. Thus, both of an inert gas and one or more chemicals including methanol, ethanol, $H_2O_2$, $H_2O$, $N_2O$, $NH_3$, and CO are fed into an etch chamber while a plasma is induced with a RF power between 600 Watts and 3000 Watts at a temperature proximate to room temperature. It should be understood that the RF power applied to a top electrode may be different than the RF power applied to a bottom electrode in a RIE chamber. Typically, one or more wafers are held on the bottom electrode during RIE processing. The resulting ions and plasma in a preferred embodiment are directed orthogonal to the top surface of the substrate along the y-axis direction. As a result, sidewall 20 is a continuous surface extending from a top surface 15t of hard mask 15 to top surface 10t of the bottom electrode.

In a preferred embodiment, the sidewall 20 is substantially vertical such that CD w1 is substantially maintained in all MTJ layers 11-15. Note that sidewall angle a tends to become more vertical as the methanol (or chemical) content increases in the noble gas/chemical mixture of step 32m. For example, angle a may be proximate to 75° when noble gas content is 100% but becomes substantially equal to 90° with a chemical content around 50% or greater. Here, the term "content" refers to flow rate ratio. Therefore, a 50:50 flow rate ratio of noble gas:chemical indicates a 50% chemical content and 50% noble gas content in the RIE gas mixture. Moreover, we have surprisingly found the combined physical and chemical etching provides for a sidewall that has substantially reduced sidewall damage compared with conventional methanol based RIE, and minimal residue.

In the exemplary embodiment, a thickness t of the DARC or BARC layer remains after the etch transfer. However, depending on the initial thickness and composition of layer 16, and the etch conditions, the DARC or BARC layer may be completely removed during etch process 32m such that hard mask top surface 15t is exposed. Therefore, a hard mask 15 is advantageously selected that has a high etch rate selectivity to the underlying MTJ layers so that a substantial thickness of hard mask remains after etch process 32m.

Figure 6:
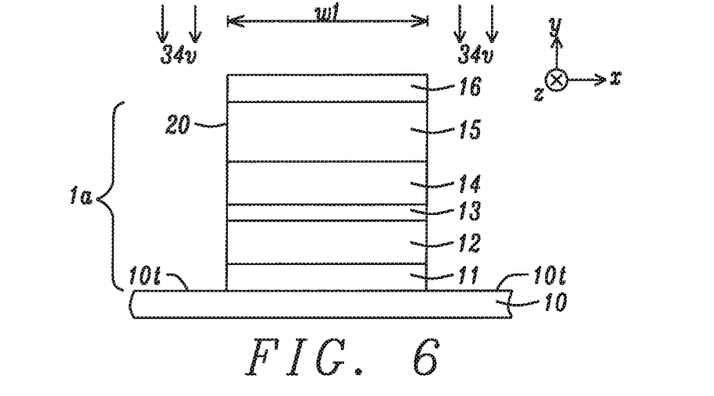
FIG. 6 is a cross-sectional view of the MTJ nanopillar in FIG. 5 after a volatilization step involving IBE, plasma sputter etch, or thermal treatment is used to remove the volatile residue according to an embodiment of the present disclosure.

An optional volatilization step 34v illustrated in FIG. 6 may be employed to remove any residue that has accumulated on sidewall 20 at the end of etch step 32m. The volatilization preferably comprises an IBE or plasma sputter etch with inert gas wherein Ar+ ions or ions of Kr, He, or Ne that are generated with a RF or DC power are directed orthogonal or with a certain penetration angle toward a top surface 10t of the substrate. The wafer (not shown) on which the MTJ nanopillar 1 is formed is typically rotated during IBE or is static for a plasma sputter etch during step 34v. In another embodiment, the volatilization is a thermal treatment in an inert or oxidant atmosphere at a temperature from 50° C. to 450° C.

According to a second embodiment shown in FIGS. 4a-4b, FIG. 5, and FIG. 6, the present disclosure encompasses a process flow where the chemical component in the combined etch of the first embodiment is separated from the physical etch component. One or two optional steps related to a chemical treatment (FIG. 5) and a volatilization (FIG. 6) may be included to realize a MTJ nanopillar 1a with minimal residue and with substantially reduced sidewall damage compared with conventional methanol based RIE in the prior art.

Figure 4A:
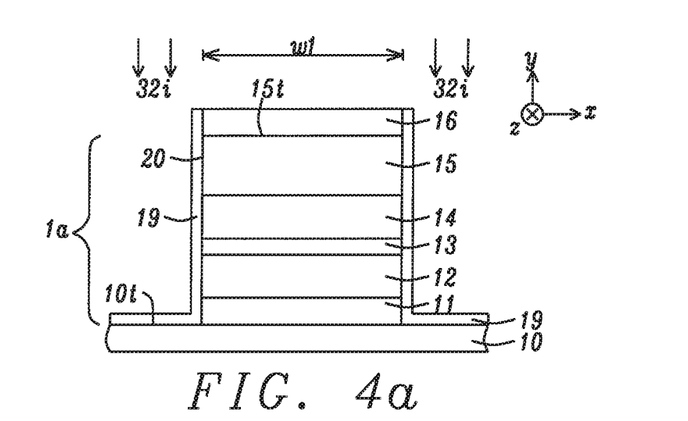
FIG. 4a is a cross-sectional view of the MTJ stack in FIG. 2 after an ion beam etch transfers the hard mask pattern through the MTJ stack of layers and causes residue to form on MTJ sidewalls.

In FIG. 4a, an IBE 32i with inert gas is employed to remove MTJ layers 11-14 that are not protected by the DARC or BARC layer 16, and by hard mask 15. As a result, MTJ nanopillar 1a is generated but has substantial non-volatile residues 19 on sidewall 20 and on substrate top surface 10t surrounding the MTJ nanopillar. Thereafter, in FIG. 5, a chemical treatment 33 may be performed to convert the non-volatile residues to volatile residues 19x on the sidewall. Although not bound by theory, it is believed the chemical treatment converts metal residue such as Ta to an oxide thereof wherein the oxide is more volatile than the metal residue. The chemical treatment comprises one or more of methanol, ethanol, and ammonia, and a temperature between room temperature and 150° C. The chemical treatment is performed in a chamber within an Anelva mainframe or the like, or may be conducted in a stand-alone process tool outside a mainframe although the latter option slows throughput. In some cases, the one or more chemicals are injected into the chamber with the substrate. Moreover, oxygen may be added to the chemical treatment chamber to enhance the rate of oxidation of the non-volatile residue 19. Alternatively, a plasma may be generated from the one or more chemicals with RIE conditions in an etch chamber. Preferably, the applied RF power is sufficiently low so that no significant damage occurs to MTJ sidewall 20. For example, the RF power may be maintained between 100 Watts and 800 Watts.

Referring to FIG. 6, volatilization step 34v may be performed to remove the volatile residue 19x and comprises an IBE or a plasma sputter etch with Ar or another inert gas flow, or a thermal treatment in an etch chamber at a temperature between 50° C. and 450° C. for a period up to 5 minutes. In either of the IBE, plasma sputter etch, or thermal treatment embodiments, an oxygen flow may be added to the inert gas flow during the volatilization step. Step 34v may have a preset endpoint time of duration based on a separate experimental study that establishes a volatilization time for a typical thickness of residue 19x. When Ar plasma sputter etching is selected, RF power is preferably kept at 100 Watts or below to avoid damage to MTJ sidewalls. Preferably, the plasma sputter etch is followed immediately in the same process chamber by an encapsulation process described later.

The present disclosure also encompasses an embodiment wherein steps 33 and 34v are performed simultaneously following etch process 32i. In particular, one or more of methanol, ethanol, $NH_3$, and CO may be introduced into an etch chamber along with an inert gas flow. A thermal treatment may be applied at a temperature between 50° C. and 450° C. while the gas mixture is in the etch chamber. In some embodiments, a plasma is generated with a RF power while the gas mixture is in the chamber and with a temperature in the range of 50° C. to 150° C. Alternatively, a plasma sputter etch may be performed at a temperature proximate to room temperature.

Figure 4B:
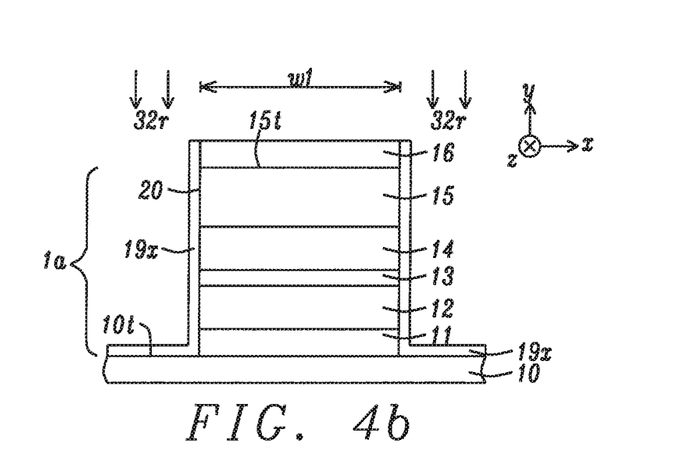
FIG. 4b is a cross-sectional view of the MTJ stack in FIG. 2 after a reactive ion etch transfers the hard mask pattern through the MTJ stack and causes residue to form on MTJ sidewalls.
Figure 5:
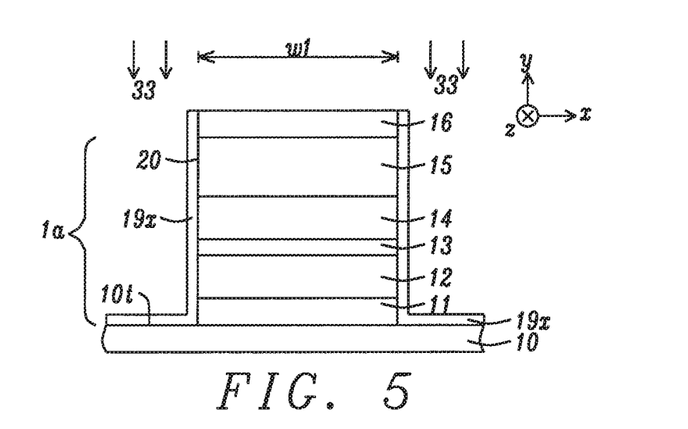
FIG. 5 is a cross-sectional view of the MTJ nanopillar in FIG. 4a or FIG. 4b after a chemical treatment convents non-volatile residue to volatile residue on MTJ sidewalls according to an embodiment of the present disclosure.

In a third embodiment that represents a modification of the process flow in the second embodiment, a reactive ion etch 32r shown in FIG. 4b and comprising one or more chemicals including methanol, ethanol, $NH_3$, and CO is inserted either before or after step 32i in FIG. 4a. In this case, chemical treatment 33 may not be necessary since step 32r may oxidize non-volatile residues 19 generated by a preceding step 32i to yield volatile residue 19x on sidewall 20. Volatilization step 34v may be employed after steps 32i and 32r to remove any volatile residue that remains on sidewall 20 of MTJ nanopillar 1a.

In a fourth embodiment, the process flow in the second embodiment is modified such that etch step 32i is replaced by etch step 32r. Chemical treatment step 33 is usually not necessary since step 32r has a tendency to serve the same purpose of oxidizing any non-volatile residue formed on sidewall 20. An optional volatilization step 34v may follow step 32r to remove any volatile residue formed on sidewall 20 of MTJ nanopillar 1a.

Figure 7:
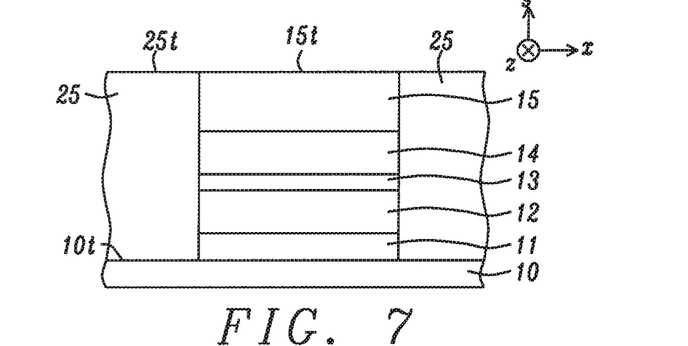
FIG. 7 is a cross-sectional view of the MTJ nanopillar in FIG. 6 following deposition of an encapsulation layer and planarization to electrically isolate the MTJ nanopillar from adjacent MTJ nanopillars.

Referring to FIG. 7, an encapsulation layer 25 that is comprised of a dielectric material is deposited over the MTJ array after clean sidewalls 20 are formed according to one of the preceding embodiments. Preferably, the encapsulation layer has a thickness of 5-250 nm and is one or more of SiN, SiO2, MgO, $Al_2O_3$, AlN, BN, or the like that is deposited immediately after volatilization (in-situ) by physical vapor deposition (PVD), chemical vapor deposition (CVD), ion beam deposition (IBD), or atomic layer deposition (ALD) without breaking the vacuum in the process chamber previously employed for plasma sputter etching in step 34v. In embodiments where a thermal treatment in a stand-alone tool is employed for step 34v, then the wafer must be exposed to atmosphere and moved to the encapsulation process chamber.

Thereafter, a chemical mechanical polish (CMP) process is performed to form a top surface 25t on the encapsulation layer that is coplanar with top surface 15t on hard mask 15. In some embodiments, the CMP process removes any DARC or BARC layer 16 remaining after etch transfer step 32m, 32i, or 32r in the previously described embodiments.

Figure 8:
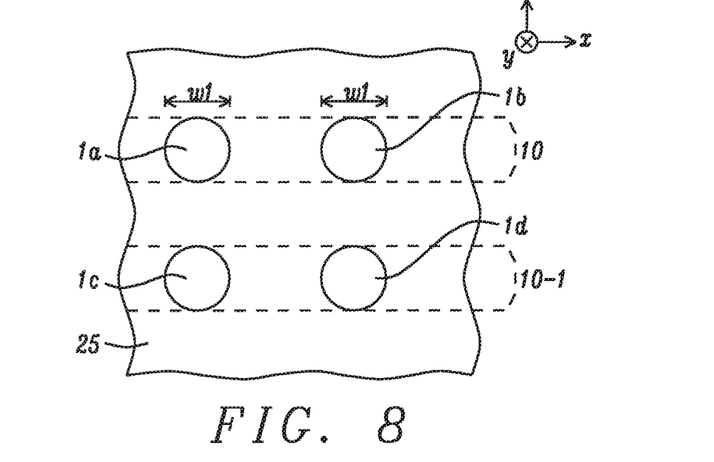
FIG. 8 is a top-down view of a plurality of MTJ nanopillars having a circular shape in an array of rows and columns according to an embodiment of the present disclosure.

Referring to FIG. 8, the plurality of island shapes of the MTJ nanopillars formed by an etch process or process flow of the present disclosure is depicted from a top-down view after removing overlying layers in the memory structure. MTJ nanopillar 1a is shown in the same row as MTJ nanopillar 1b, and MTJ nanopillars 1c, 1d are in the same column as MTJ nanopillars 1a and 1b, respectively. As explained previously, the MTJ nanopillars are depicted with a circular shape but may have elliptical shapes in other embodiments. Generally, millions of MTJ nanopillars are formed in an array but only four are illustrated here to simplify the drawing.

Thereafter, a top electrode layer comprised of a plurality of parallel conductive lines (not shown) is formed by a conventional method on the MTJ nanopillars and encapsulation layer 25 as appreciated by those skilled in the art. A first top electrode line may contact a top surface 15t of MTJ nanopillars 1a, 1c while a second top electrode line contacts top surface 15t in MTJ nanopillars 1b, 1d. Conductive lines in the top electrode layer are preferably formed along the z-axis direction that is orthogonal to the conductive lines along the x-axis direction in the bottom electrode layer. Therefore, bottom electrode line 10 may contact a bottom surface of both MTJ nanopillars 1a and 1b while a second bottom electrode line 10-1 contacts the bottom surfaces of MTJ nanopillars 1c and 1d.

Figure 9:
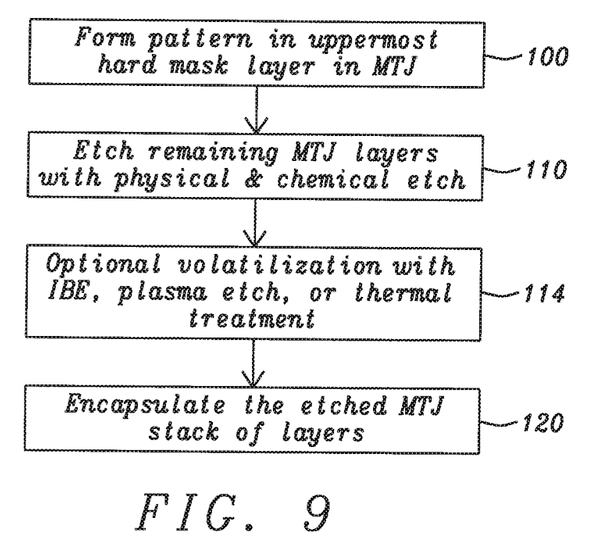
FIG. 9 is a flow diagram showing a sequence of steps of forming a MTJ nanopillar according to an embodiment of the present disclosure.

Referring to FIG. 9, a flow diagram is provided for the process flow of the first embodiment where a pattern with a CD is formed in the MTJ hard mask layer by an etch process 100 that comprises step 30 or both steps 30, 31 described previously. In step 110, a combined physical/chemical etch 32m is applied to transfer the pattern through the remaining MTJ layers and thereby form a plurality of MTJ nanopillars. An optional volatilization step 114 comprising IBE, plasma etching, or a thermal treatment is performed after step 110. Finally, an encapsulation layer is formed around the MTJ nanopillars in step 120 to electrically isolate the MTJ nanopillars from each other.

Figure 10:
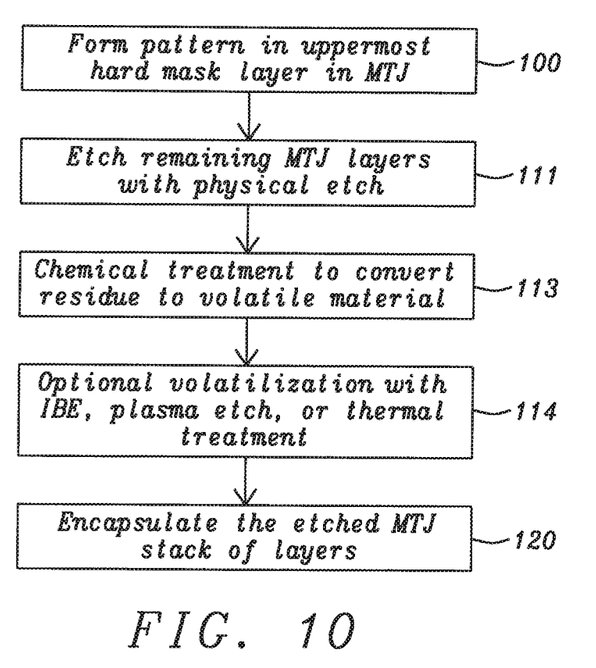
FIGS. 10-11 are flow diagrams showing alternative sequences of forming MTJ nanopillars having sidewalls that are essentially free of damage and residue according to embodiments of the present disclosure.

In FIG. 10, a flow diagram is depicted for the process flow of the second embodiment of the present disclosure where step 100 is followed by a physical (IBE) etch 32i in step 111, a chemical treatment 33 in step 113, volatilization process 34v in step 114, and then encapsulation with step 120.

Figure 11:
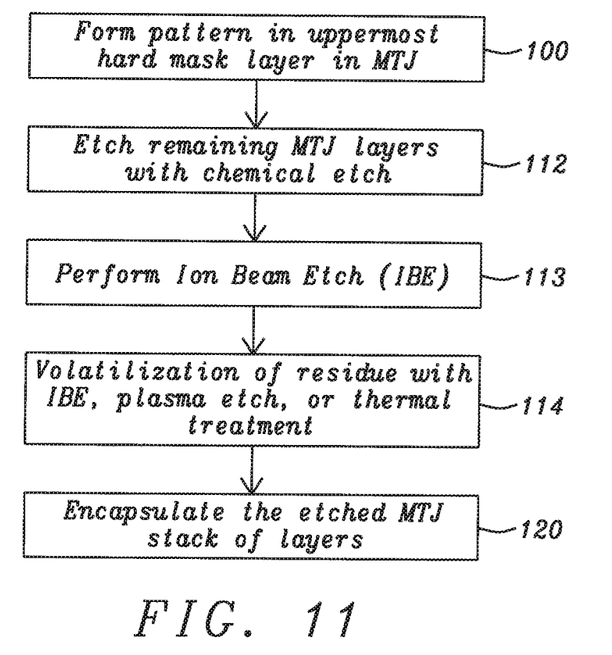

FIG. 11 shows a flow diagram for the process flow of the third embodiment of the present disclosure where step 100 is followed by a chemical (RIE) etch 32r in step 112, an IBE step 111, optional volatilization step 114, and finally encapsulation in step 120. In alternative embodiment described previously, IBE step 111 may precede RIE step 112, followed by optional step 114, and step 120.

We have demonstrated the benefits of the combined physical/chemical etch process of the present disclosure with results from an experiment where a series of MTJ nanopillars with various diameters (w1 in FIG. 8), and reference MTJ nanopillars with the same range of device sizes were fabricated. All process flows described below included etching a DARC layer/Ta hard mask stack with conditions comprising CF4 RIE, 500 Watts(top)/52 W (bottom), 50 sccm CF4 only, and 4.5 mT of pressure followed by a passivation step comprised of flowing oxygen into the etching chamber. Each MTJ stack of layers in all devices included a MgO tunnel barrier layer between a CoFeB free layer and a CoFeB reference layer, a Ta hard mask, and a TaN/NiCr seed layer.

Following the etch through the hard mask, reference MTJ nanopillars were fabricated by a conventional method involving an Ar IBE comprised of 450 mm IBS (Ion Beam Source) and 800 W of IBS RF power, 200V/950V of G1/G2 voltage, 400 mA of G1 current, 60 rpm rotation, 40° and 80° penetration angles with no subsequent volatilization process. The wafers were exposed to air between MTJ etching and encapsulation.

According to a process described in the first embodiment, a MTJ stack of layers 11-14 (FIG. 3) with an overlying patterned hard mask layer 15 was etched with a RIE step comprising a 50% Ar/50% methanol mixture and a RF power of 1500 Watts(top)/1100 Watts (bottom) for 60 seconds. The Ar flow rate was 7.5 standard cubic centimeters per minute (sccm) and the CH3OH flow rate was 7.5 sccm. Thereafter, a volatilization step comprised of Ar plasma sputter etching with a RF power of 75 Watts and a 60 sccm flow rate of Ar was employed for a period of 132 seconds at room temperature.

Figure 12:
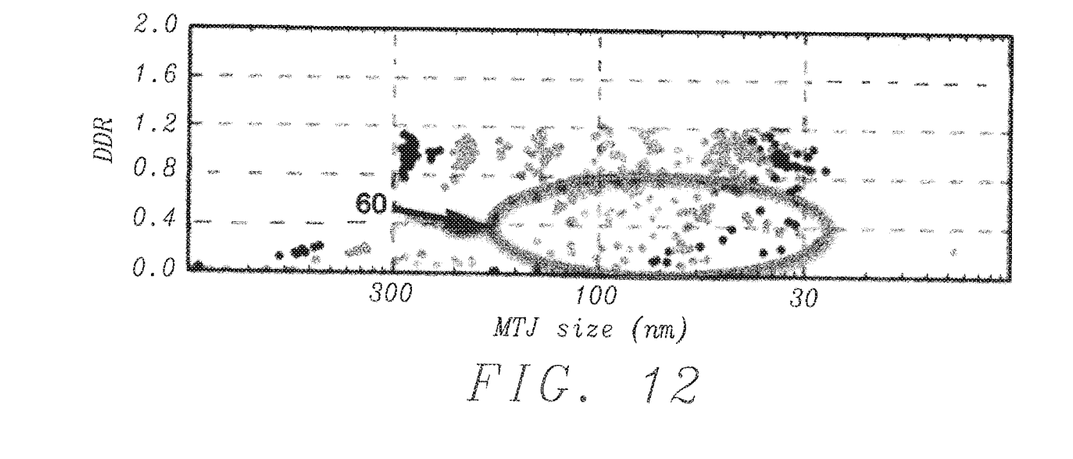

FIG. 12 is a plot of magnetoresistive ratio (DRR) vs. MTJ size (measured at 125° C.) for the reference MTJ nanopillars that were patterned by the IBE step. MTJ nanopillar size ranges from about 30 nm to 300 nm. Circled region 60 indicates a significant population of low tails corresponding to devices where redeposited metal residue bridges the MgO tunnel barrier layer and causes shorts.

Figure 13:
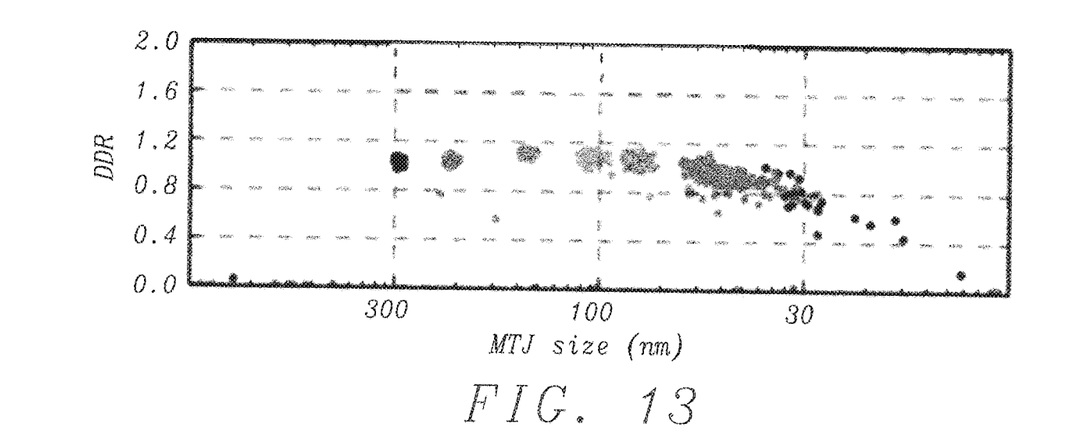
FIG. 13 is a similar plot for MTJ nanopillars formed by a combined physical/chemical etch followed by an Ar plasma etch volatilization step according to an embodiment of the present disclosure.

In FIG. 13, results are plotted for MTJ nanopillars that were etched by the 50/50 Ar/CH3OH etch, and then subjected to a volatilization step with Ar plasma sputter etch There is clearly a substantial reduction in the number of devices with low DRR and thus a higher overall DRR, especially for MTJ nanopillar sizes between 30 and 100 nm. DRR is also more uniform for each MTJ size in FIG. 13 compared with FIG. 12, which indicates a more controlled process that is suitable for a manufacturing environment. Furthermore, the etch process embodiments disclosed herein may be readily implemented in existing manufacturing lines since no new tools or materials are required.

While this disclosure has been particularly shown and described with reference to, the preferred embodiment thereof, it will be understood by those skilled in the art that various changes in form and details may be made without departing from the spirit and scope of this disclosure.

What is claimed is:

1. A method comprising:
providing a stack of magnetic tunnel junction (MTJ) layers on a first electrode wherein the stack of MTJ layers includes a reference layer, a free layer, and a tunnel barrier layer between the reference layer and free layer;
patterning the stack of MTJ layers by a reactive ion etch that includes a physical component in the form of noble gas ions and a chemical component; and
performing a single RF power volatilization step to remove volatile residue from a sidewall of the patterned stack of MTJ layers after the reactive ion etch, wherein the single RF power volatilization step includes a plasma sputter etch performed with an RF power of about 75 Watts.

2. The method of claim 1, wherein the noble gas ions are selected from the group consisting of Ar, Kr, Ne, and Xe.

3. The method of claim 1, wherein the chemical component includes ethanol, $H_2O_2$, $H_2O$, $N_2O$, $NH_3$, and CO.

4. The method of claim 1, wherein the reactive ion etch incudes a reactive ion gas mixture having a 50:50 flow rate ratio of noble gas:chemical component.

5. The method of claim 1, wherein the etching process further includes applying a flow of oxygen.

6. The method of claim 1, wherein the plasma sputter etch is further performed with an inert gas having a flow rate of about 60 sccm.

7. The method of claim 1, wherein the time it takes for the performing of the volatilization step to remove volatile residue from the sidewall of the patterned stack of MTJ layers is performed is greater than a time it takes for the patterning of the stack of MTJ layers by the reactive ion etch that includes the physical component in the form of noble gas ions and the chemical component.

8. A method comprising:
providing a stack of magnetic tunnel junction (MTJ) layers, wherein the stack of MTJ layers includes a reference layer, a free layer, and a tunnel barrier layer between the reference layer and free layer;
patterning the stack of MTJ layers by performing an etching process that includes an inert gas, wherein a nonvolatile residue is disposed on sidewalls of the patterned stack of MTJ layers after the patterning of the stack of MTJ layer;
performing a chemical treatment on the patterned stack of MTJ layers to convert the nonvolatile residue to volatile residue, wherein the chemical treatment includes an applying a material, and wherein the applying of the material occurs in the absence of a RF power; and
performing a volatilization step to remove volatile residue from the sidewalls of the patterned stack of MTJ layers, wherein the volatilization step includes performing a process selected from the group consisting of ion beam etching, plasma sputter etching and thermal treatment.

9. The method of claim 8, wherein the etching process is an ion beam etching process.

10. The method of claim 8, wherein the material is selected from the group consisting of methanol, ethanol, ammonia, CO and combinations thereof.

11. The method of claim 8, wherein the selected process for the volatilization step is the ion beam etching and includes introducing an oxygen flow.

12. The method of claim 8, wherein the selected process for the volatilization step is the plasma sputter etching and includes applying an inert gas and a RF power equal to or less than 100 Watts.

13. The method of claim 8, wherein the selected process for the volatilization step is the thermal treatment and includes applying a temperature ranging from about 50° C. to about 450° C.

14. The method of claim 13, wherein the thermal treatment further includes introducing an oxygen flow.

15. A method comprising:
providing a stack of magnetic tunnel junction (MTJ) layers;
patterning a layer from the stack of MTJ layers while other layers from the stack of MTJ layers are not patterned;
patterning the other layers from the stack of MTJ layers by performing an etching process that includes an inert gas, wherein a metal residue is disposed on sidewalls of the patterned other layers from the stack of MTJ layers after the patterning of the other layers;
oxidizing the metal residue to form a metal oxide residue on the sidewalls of the patterned other layers from the stack of MTJ layers, wherein the oxidizing of the metal residue to form the metal oxide residue includes applying a chemical to the metal residue via a non-plasma application process; and
removing the metal oxide from the sidewalls of the patterned other layers from the stack of MTJ layers.

16. The method of claim 15, wherein the chemical is selected from the group consisting of methanol, ethanol, ammonia, CO and combinations thereof.

17. The method of claim 15, wherein the removing of the metal oxide includes performing a process selected from the group consisting of ion beam etching, plasma sputter etching and thermal treatment.

18. The method of claim 15, wherein the patterning of the layer from the stack of MTJ layers includes performing an etching process selected from the group consisting of an ion beam etch with inert gas and a reactive ion etch with a fluorocarbon or chlorocarbon.

19. The method of claim 15, wherein the removing of the metal oxide includes performing a thermal treatment process at temperature ranging from about 50° C. to about 450° C.

* * * * *